(12) United States Patent
Li (10) Patent No.: US 12,315,694 B2
(45) Date of Patent: May 27, 2025

(54) ELECTRON BEAM SYSTEM

(71) Applicant: FOCUS-EBEAM TECHNOLOGY (BEIJING) CO., LTD., Beijing (CN)

(72) Inventor: Shuai Li, Beijing (CN)

(73) Assignee: FOCUS-EBEAM TECHNOLOGY (BEIJING) CO., LTD., Beijing (CN)

(*) Notice: Subject to any disclaimer, the term of this patent is extended or adjusted under 35 U.S.C. 154(b) by 49 days.

(21) Appl. No.: 17/757,133

(22) PCT Filed: Jan. 26, 2022

(86) PCT No.: PCT/CN2022/074101
§ 371 (c)(1),
(2) Date: Jun. 9, 2022

(87) PCT Pub. No.: WO2022/117125
PCT Pub. Date: Jun. 9, 2022

(65) Prior Publication Data
US 2023/0317404 A1 Oct. 5, 2023

(30) Foreign Application Priority Data

Dec. 2, 2020 (CN) .......................... 202011389634.2

(51) Int. Cl.
*H01J 37/28* (2006.01)
*H01J 37/10* (2006.01)
(Continued)

(52) U.S. Cl.
CPC .......... *H01J 37/1474* (2013.01); *H01J 37/10* (2013.01); *H01J 37/244* (2013.01); *H01J 37/28* (2013.01)

(58) Field of Classification Search
None
See application file for complete search history.

(56) References Cited

U.S. PATENT DOCUMENTS

| 4,675,524 A | 6/1987 | Frosien |
| 4,785,176 A | 11/1988 | Frosien |

(Continued)

FOREIGN PATENT DOCUMENTS

| CN | 1042029 A | 5/1990 |
| CN | 1630926 A | 6/2005 |

(Continued)

OTHER PUBLICATIONS

International Search Report in the international application No. PCT/CN2022/074101, mailed on Apr. 12, 2022.

(Continued)

*Primary Examiner* — Eliza W Osenbaugh-Stewart
(74) *Attorney, Agent, or Firm* — Syncoda LLC; Feng Ma (57) ABSTRACT

Provided is an electron beam system, including: an electron source, configured to generate an electron beam; a first beam guide, configured to accelerate the electron beam; a second beam guide, configured to accelerate the electron beam; a first control electrode arranged between the first beam guide and the second beam guide, configured to change movement directions of backscattered electrons and secondary electrons generated by the electron beam acting on a specimen to be tested; a first detector arranged between the first beam guide and the first control electrode, configured to receive the backscattered electrons generated by the electron beam acting on the specimen to be tested. The first control electrode according to the embodiments of the present disclosure changes the movement directions of the backscattered electrons and secondary electrons generated by the electron beam generated by the electron source acting on the specimen to be tested, so that the first detector arranged between the first beam guide and the first control electrode can receive pure backscattered electrons generated by the electron beam acting on the specimen to be tested.

7 Claims, 3 Drawing Sheets

(51) Int. Cl.
   *H01J 37/147*   (2006.01)
   *H01J 37/244*   (2006.01)

(56) References Cited

U.S. PATENT DOCUMENTS

| | | |
|---|---|---|
| 4,831,266 A | 5/1989 | Frosien |
| 4,926,054 A | 5/1990 | Frosien |
| 4,963,823 A | 10/1990 | Otto |
| 5,146,090 A | 9/1992 | Plies |
| 5,608,218 A | 3/1997 | Sato |
| 5,780,859 A | 7/1998 | Feuerbaum |
| 5,939,720 A | 8/1999 | Todokoro |
| 6,107,633 A | 8/2000 | Frosien |
| 6,194,729 B1 | 2/2001 | Weimer |
| 6,392,231 B1 | 5/2002 | Chen |
| 6,407,387 B1 | 6/2002 | Frosien |
| 6,444,981 B1 | 9/2002 | Todokoro |
| 6,498,345 B1 | 12/2002 | Weimer |
| 6,512,228 B2 | 1/2003 | Todokoro |
| 6,617,579 B2 | 9/2003 | Yonezawa |
| 6,642,520 B2 | 11/2003 | Kimura |
| 6,667,476 B2 | 12/2003 | Todokoro |
| 6,855,938 B2 | 2/2005 | Preikszas |
| 6,872,944 B2 | 3/2005 | Todokoro |
| 7,233,008 B1 | 6/2007 | Petrov |
| 7,425,701 B2 | 9/2008 | Steigerwald |
| 7,544,937 B2 | 6/2009 | Frosien |
| 7,705,302 B2 | 4/2010 | Aoki |
| 7,759,653 B2 | 7/2010 | Chen |
| 7,928,405 B2 | 4/2011 | Adamec |
| 7,960,697 B2 | 6/2011 | Chen |
| 8,319,192 B2 | 11/2012 | Ren |
| 8,742,342 B2 | 6/2014 | Okai |
| 8,785,879 B1 | 7/2014 | Frosien |
| 9,000,370 B2 | 4/2015 | Ren |
| 9,029,766 B2 | 5/2015 | Morishita |
| 9,354,188 B2 | 5/2016 | Albiez |
| 9,362,086 B2 | 6/2016 | Tůma |
| 9,490,100 B2 | 11/2016 | Sytař |
| 9,583,306 B2 | 2/2017 | Li |
| 9,601,303 B2 | 3/2017 | Frosien |
| 9,620,331 B1 | 4/2017 | Bhattiprolu |
| 9,767,986 B2 | 9/2017 | Brown |
| 9,934,939 B2 | 4/2018 | Kim |
| 10,008,360 B2 | 6/2018 | Li |
| 10,103,002 B1 | 10/2018 | Gamm |
| 10,658,152 B1 | 5/2020 | Hendrich |
| 10,777,382 B2 | 9/2020 | Li |
| 2002/0104969 A1 | 8/2002 | Chen |
| 2002/0148960 A1 | 10/2002 | Todokoro |
| 2003/0127604 A1 | 7/2003 | Todokoro |
| 2003/0209667 A1 | 11/2003 | Petrov et al. |
| 2004/0046125 A1 | 3/2004 | Chen |
| 2004/0056207 A1 | 3/2004 | Petrov et al. |
| 2004/0089805 A1 | 5/2004 | Todokoro et al. |
| 2004/0245465 A1 | 12/2004 | Steigerwald |
| 2006/0049348 A1 | 3/2006 | Petrov et al. |
| 2006/0060780 A1 | 3/2006 | Masnaghetti et al. |
| 2006/0163478 A1 | 7/2006 | Jaksch et al. |
| 2006/0186351 A1 | 8/2006 | Nishiyama |
| 2006/0226360 A1 | 10/2006 | Frosien |
| 2008/0099674 A1 | 5/2008 | Bihr et al. |
| 2008/0121810 A1 | 5/2008 | Liu et al. |
| 2008/0191135 A1 | 8/2008 | Aoki |
| 2008/0230694 A1 | 9/2008 | Frosien |
| 2010/0038538 A1 | 2/2010 | Drexel |
| 2010/0297362 A1 | 11/2010 | Budach et al. |
| 2012/0025074 A1 | 2/2012 | Barbi |
| 2012/0049064 A1 | 3/2012 | Ren |
| 2013/0214155 A1 | 8/2013 | Winkler |
| 2014/0077079 A1 | 3/2014 | Hoque et al. |
| 2014/0175279 A1 | 6/2014 | Agemura |
| 2014/0361167 A1 | 12/2014 | Morishita |
| 2016/0064184 A1 | 3/2016 | Brown et al. |
| 2016/0172150 A1 | 6/2016 | Li |
| 2016/0217968 A1 | 7/2016 | Li et al. |
| 2016/0225582 A1 | 8/2016 | Schultz et al. |
| 2016/0365221 A1 | 12/2016 | Preikszas |
| 2017/0018394 A1 | 1/2017 | Sohda et al. |
| 2017/0047192 A1 | 2/2017 | Frosien |
| 2017/0236683 A1 | 8/2017 | Hegele et al. |
| 2017/0271124 A1 | 9/2017 | Sasaki et al. |
| 2017/0309443 A1 | 10/2017 | Han |
| 2017/0329025 A1 | 11/2017 | Brown et al. |
| 2018/0286632 A1 | 10/2018 | Biberger |
| 2018/0364563 A1 | 12/2018 | Virdi et al. |
| 2019/0385810 A1 | 12/2019 | Sato et al. |
| 2020/0075287 A1 | 3/2020 | Jen et al. |
| 2020/0234914 A1 | 7/2020 | Li |
| 2020/0273665 A1 | 8/2020 | Morishita |
| 2020/0333271 A1 | 10/2020 | Hendrich et al. |
| 2021/0110994 A1 | 4/2021 | Li et al. |

FOREIGN PATENT DOCUMENTS

| | | |
|---|---|---|
| CN | 1820194 A | 8/2006 |
| CN | 101388317 A | 3/2009 |
| CN | 101390186 A | 3/2009 |
| CN | 101996839 A | 3/2011 |
| CN | 103733299 A | 4/2014 |
| CN | 103839743 A | 6/2014 |
| CN | 103890895 A | 6/2014 |
| CN | 104897700 A | 9/2015 |
| CN | 106575594 A | 4/2017 |
| CN | 106920723 A | 7/2017 |
| CN | 207425790 U | 5/2018 |
| CN | 108231511 A | 6/2018 |
| CN | 108807118 A | 11/2018 |
| CN | 208256614 U | 12/2018 |
| CN | 109300759 A | 2/2019 |
| CN | 110376229 A | 10/2019 |
| CN | 110383414 A | 10/2019 |
| CN | 110869752 A | 3/2020 |
| EP | 1435640 A2 | 7/2004 |
| JP | 2000164167 A | 6/2000 |
| JP | 2000188310 A | 7/2000 |
| JP | 2005521215 A | 7/2005 |
| JP | 2008004329 A | 1/2008 |
| JP | 2009037939 A | 2/2009 |
| JP | 5004318 B2 | 8/2012 |
| JP | 2013058314 A | 3/2013 |
| JP | 2015170518 A | 9/2015 |
| JP | 2017199606 A | 11/2017 |
| WO | 2013035389 A1 | 3/2013 |

OTHER PUBLICATIONS

International Search Report in the international application No. PCT/CN2021/135541, mailed on Jan. 30, 2022. 7 pages with English translation.

Written Opinion of the International Search Authority in the international application No. PCT/CN2021/135541, mailed on Jan. 30, 2022. 8 pages with English translation.

International Search Report in the international application No. PCT/CN2018/085300, mailed on Aug. 21, 2018. 4 pages.

Written Opinion of the International Search Authority in the international application No. PCT/CN2018/085300, mailed on Aug. 21, 2018. 4 pages.

International Search Report in the international application No. PCT/CN2018/075564, mailed on Aug. 23, 2018. 5 pages.

Written Opinion of the International Search Authority in the international application No. PCT/CN2018/075564, mailed on Aug. 23, 2018. 5 pages.

International Search Report in the international application No. PCT/CN2019/100871, mailed on Oct. 30, 2019. 3 pages.

Written Opinion of the International Search Authority in the international application No. PCT/CN2019/100871, mailed on Oct. 30, 2019. 5 pages.

Supplementary European Search Report in the European application No. 19876263.5, mailed on May 7, 2021. 10 pages.

(56) References Cited

OTHER PUBLICATIONS

Written Opinion of the International Search Authority in the international application No. PCT/CN2022/074101, mailed on Apr. 12, 2022. 6 pages with English translation.

ELECTRON BEAM SYSTEM

CROSS-REFERENCE TO RELATED APPLICATION

This application is based on and claims priority to Chinese Patent Application No. 202011389634.2 filed on Dec. 2, 2020, the content of which is hereby incorporated by reference in its entirety.

TECHNICAL FIELD

The present disclosure relates to the technical field of microscopes, in particular, relates to an electron beam system.

BACKGROUND

In the related art, a scanning electron microscope is a commonly used microscopic analysis instrument, in which an electron beam is converged on a specimen to be tested through an objective lens of the scanning electron microscope to generate a micro beam spot, in an area of which the electron beam acts on the specimen to be tested to generate secondary electrons (SEs), backscattered electrons (BSEs) and other signal electrons, and morphology of the surface of the specimen to be tested can be observed by a detector and the material composition of the specimen to be tested can be analyzed.

The secondary electrons can denote the morphological features of the specimen to be tested, the backscattered electrons are related to the atomic number of the specimen to be tested, and more to denote material information of the specimen to be tested. The backscattered electrons emitted at a small angle relative to the surface of the specimen to be tested are affected by the surface fluctuation of the specimen to be tested, and thus can also reflect morphology of the surface of the specimen to be tested. Thus, different types of signal electrons, signal electrons emitted at different angles reflect different information of the specimen to be tested. Therefore, by detecting pure secondary electrons and backscattered electrons, respectively, it is possible to form a picture with a better contrast to reflect information of surface morphology or material, thereby facilitating more accurate analysis of the specimen to be tested.

The present disclosure is hereby proposed.

SUMMARY

The technical problem to be solved by the embodiments of the present disclosure is to overcome the deficiencies of the related art, and provide an electron beam system in which a first detector arranged between a first beam guide and a first control electrode can receive pure backscattered electrons generated by an electron beam acting on a specimen to be tested.

In order to solve the above technical problem, the technical solution adopted in an embodiment of the present disclosure is as follows.

An electron beam system includes an electron source, a first beam guide, a second beam guide, a first control electrode, and a first detector.

The electron source is configured to generate an electron beam.

The first beam guide is configured to accelerate the electron beam.

The second beam guide is configured to accelerate the electron beam.

The first control electrode is arranged between the first beam guide and the second beam guide, and is configured to change movement directions of backscattered electrons and secondary electrons generated by the electron beam acting on a specimen to be tested.

The first detector is arranged between the first beam guide and the first control electrode, and is configured to receive the backscattered electrons generated by the electron beam acting on the specimen to be tested.

In some alternative embodiments, the first control electrode is of an annular shape, and a thickness of a radial cross-section of the first control electrode is gradually increased in a direction outwardly from a center of a circle.

In some alternative embodiments, the first control electrode is of an annular shape, and a radial cross-section of the first control electrode is of a rectangular, triangular, or trapezoidal shape.

In some alternative embodiments, the system further includes a shielding device and a second detector.

The shielding device is of an annular shape, and a radial cross-section of the shielding device in a direction outwardly from a center of a circle is a groove opening outward.

The second detector is arranged in the groove of the shielding device, and is configured to receive secondary electrons generated by the electron beam acting on the specimen to be tested.

The shielding device has a porous structure, and the shielding device is arranged on an upper end of the second beam guide.

In some alternative embodiments, a second control electrode is arranged between the second detector and the groove of the shielding device.

In some alternative embodiments, the system further includes a first lens device and a second lens device.

The first lens device is arranged on an outer periphery of the first beam guide, and is configured to converge the electron beam.

The second lens device is arranged on an outer periphery of the second beam guide, and is configured to converge the electron beam.

In the above solution, the system further includes a third detector and a third control electrode.

The third detector is arranged between an upper pole piece of the second lens device and a lower pole piece of the second lens device, and is configured to receive backscattered electrons generated by the electron beam acting on the specimen to be tested.

The third control electrode is arranged between the upper pole piece of the second lens device and the third detector.

The third control electrode is of an annular shape, and a radial cross-section of the third control electrode is L-shaped.

The third detector is connected to the third control electrode in insulation.

In some alternative embodiments, the system further includes a fourth control electrode.

The fourth control electrode is arranged between a lower pole piece of the second lens device and the specimen to be tested.

The first detector is arranged on a lower end of the first beam guide.

With the above technical solution, the embodiments of the present disclosure have the following advantages as compared with the related art.

An electron beam system is provided according to an embodiment of the present disclosure, in which a first control electrode is arranged between a first beam guide and a second beam guide. The first control electrode changes movement directions of backscattered electrons and the secondary electrons generated by the electron beam, generated by an electron source, acting on the specimen to be tested, so that a first detector arranged between the first beam guide and the first control electrode can receive pure backscattered electrons generated by an electron beam acting on the specimen to be tested.

The specific implementations of the present disclosure will be described in further detail in conjunction with the drawings.

BRIEF DESCRIPTION OF THE DRAWINGS

The drawings, as a part of the present disclosure, are used to provide a further understanding of the present disclosure. The schematic embodiments of the present disclosure and its description serve to explain the present disclosure, but do not constitute inappropriate limitations for the present disclosure. It will be apparent that the drawings in the following description are merely embodiments, and that other drawings may be drawn from these drawings without creative efforts for those skilled in the art. In the drawings.

In the drawings: 1. Electron source; 2. Electron acceleration structure; 3. First beam guide; 4. First lens device; 5. First detector; 6. First control electrode; 7. Shielding device; 8. Second control electrode; 9. Second detector; 10. Second beam guide; 11. First deflector; 12. Second deflector; 13. Second lens device; 14. Third control electrode; 15. Insulator; 16. Third detector; 17. Fourth control electrode; 18. Specimen to be tested; 19. Specimen stage.

It should be noted that these drawings and text descriptions are not intended to limit the scope of the present disclosure in any way, but rather to illustrate the concept of the present disclosure to those skilled in the art by referring to specific embodiments.

DETAILED DESCRIPTION

In order to make the objects, technical solutions and advantages of the embodiments of the present disclosure clearer, the technical solutions in the embodiments will be clearly and completely described below in conjunction with the drawings in the embodiments of the present disclosure. The following embodiments are intended to illustrate the present disclosure, but are not intended to limit the scope of the present disclosure.

In the description of the present disclosure, it should be noted that the orientation or positional relationship indicated by the terms "upper", "lower", "front", "back", "left", "right", "vertical", "inside", "outside" and the like is based on the orientation or positional relationship shown in the drawings, and is only for convenience of description and simplification of description of the present disclosure, rather than indicating or implying that the device or element must have a specific orientation, be constructed and operated in the specific orientation, and therefore should be construed as limitations the present disclosure.

In the description of the present disclosure, it should be noted that, unless otherwise clearly defined and limited, the terms "install", "linked" and "connected" should be understood in a broad sense. For example, it may be a fixed connection, a detachable connection, or an integral connection; it may be a mechanical connection or an electrical connection; it may be directly connected or indirectly connected through an intermediate medium. For those skilled in the art, the specific meanings of the above terms in the present disclosure may be understood in specific situations.

Figure 1:
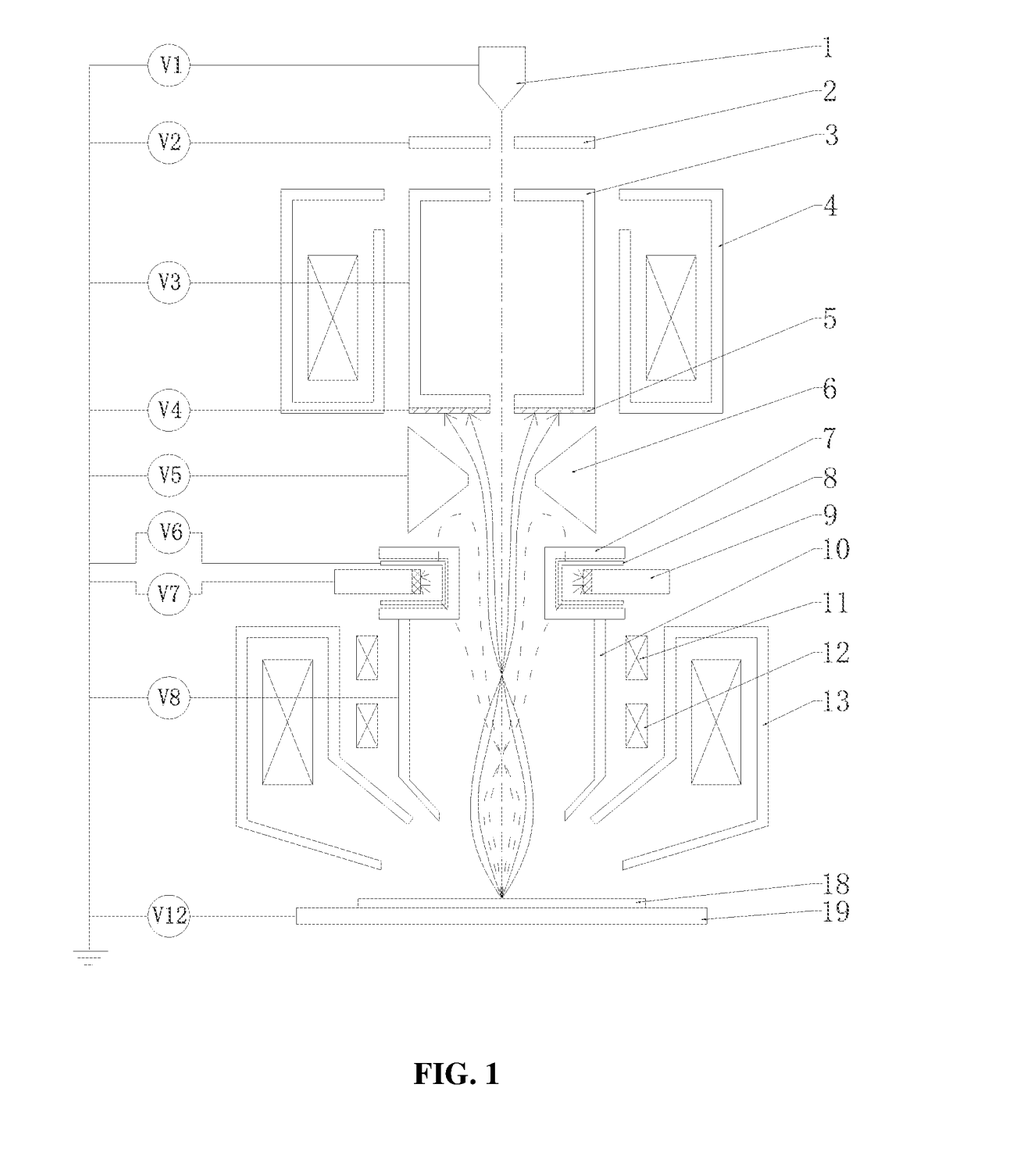
FIG. 1 is a schematic structural diagram of an implementation of an electron beam system according to an embodiment of the present disclosure.
Figure 2:
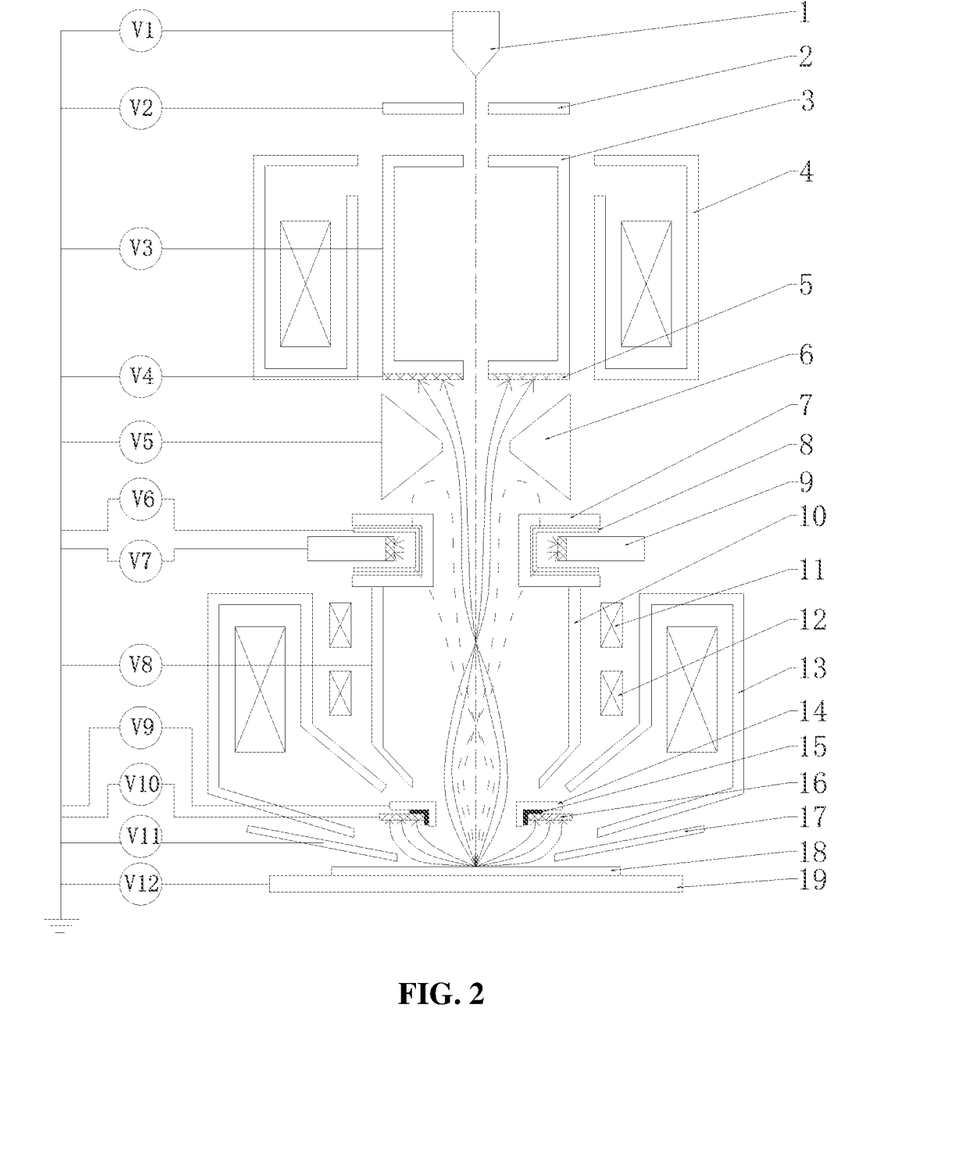
FIG. 2 is a schematic structural diagram of another implementation of an electron beam system according to an embodiment of the present disclosure.
Figure 3:
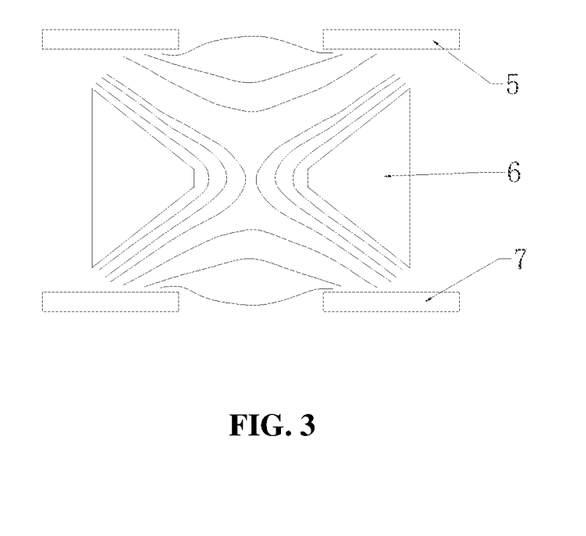
FIG. 3 is a schematic diagram of an electric field formed among a first control electrode, a first beam guide, and a second beam guide according to an embodiment of the present disclosure.

As shown in FIGS. 1 to 3, an electron beam system is provided according to an embodiment of the present disclosure. The electron beam system includes an electron source 1, a first beam guide 3, a first detector 5, a first control electrode 6, and a second beam guide 10. The electron source 1 is configured to generate an electron beam, the first beam guide 3 is configured to accelerate the electron beam, and the second beam guide 10 is configured to accelerate the electron beam.

The first control electrode 6 is arranged between the first beam guide 3 and the second beam guide 10, and is configured to change movement directions of the backscattered electrons and secondary electrons generated by the electron beam acting on the specimen to be tested 18.

The first detector 5 is arranged between the first beam guide 3 and the first control electrode 6, and is configured to receive the backscattered electrons generated by the electron beam acting on the specimen to be tested 18.

Specifically:

according to an embodiment of the present disclosure, an electron beam system is provided with an electron source 1, a first beam guide 3, a first detector 5, a first control electrode 6, a second beam guide 10, and a specimen stage 19 arranged in sequence along the direction from the electron source 1 to the specimen to be tested 18.

The electron beam generated by the electron source 1 passes through the first beam guide 3, the first detector 5, the first control electrode 6, and the second beam guide 10 in sequence, and acts on the specimen to be tested 18 placed on the specimen stage 19. The electron beam acts on the specimen to be tested 18 to generate backscattered electrons and secondary electrons. The first control electrode 6 changes movement directions of the backscattered electrons and secondary electrons generated by the electron beam acting on the specimen to be tested 18. The first detector 5 receives secondary electrons generated by the electron beam acting on the specimen to be tested 18.

According to an embodiment of the present disclosure, an electron beam system is provided, in which a first control electrode 6 is arranged between a first beam guide 3 and a second beam guide 10. The first control electrode 6 changes the movement directions of the backscattered electrons and secondary electrons generated by the electron beam generated by the electron source 1 acting on the specimen to be tested 18, so that the first detector 5 arranged between the first beam guide 3 and the first control electrode 6 can receive pure backscattered electrons generated by the electron beam acting on the specimen to be tested 18.

In some alternative embodiments, the first control electrode 6 is of an annular shape, and a thickness of a radial cross-section of the first control electrode 6 is gradually increased in a direction outwardly from a center of a circle.

The first control electrode 6 is of an annular shape, and a central hole of the first control electrode 6 is used to allow the electron beams and backscattered electrons to pass through. The thickness of a radial cross-section of the first control electrode is gradually increased in a direction outwardly from a center of a circle. That is, the thickness of the annular first control electrode 6 gradually decreases from the outer periphery toward the center of the circle.

As shown in FIG. 3, with the electric field formed by the first control electrode 6 of the above-described shape, the movement directions of the backscattered electrons and the secondary electrons generated by the electron beam generated by the electron source 1 acting on the specimen to be tested 18 can be better changed, so that the first detector 5 arranged between the first beam guide 3 and the first control electrode 6 can receive pure backscattered electrons generated by the electron beam acting on the specimen to be tested 18.

In some alternative embodiments, the first control electrode 6 is of an annular shape, and a radial cross-section of the first control electrode 6 is of a rectangular, triangular, or trapezoidal shape.

When the radial cross-section of the first control electrode 6 is of a triangular shape, one corner of the triangle faces the center of the circle of the annular first control electrode 6.

When the radial cross-section of the first control electrode 6 is of a trapezoidal shape, the upper edge of the trapezoid faces the center of the circle of the annular first control electrode 6.

In some alternative embodiments, an electron beam system is provided according to an embodiment of the present disclosure. The electron beam system further includes a shielding device 7 and a second detector 9. The shielding device 7 is of an annular shape, and a radial cross-section of the shielding device 7 in a direction outwardly from a center of a circle is a groove opening outward. A second detector 9 is arranged in the groove of the shielding device 7 and is configured to receive secondary electrons generated by the electron beam acting on the specimen to be tested 18.

Further, the shielding device 7 has a porous structure, and the shielding device 7 is arranged on the upper end of the second beam guide 10.

Further, a second control electrode 8 is arranged between the second detector 9 and the groove of the shielding device 7.

Specifically:

The shielding device 7 is of an annular shape, and the central hole of the shielding device 7 is used to allow the electron beam, backscattered electrons and secondary electrons to pass through. The radial cross-section of the shielding device 7 is a groove opening outward. A second detector 9 is arranged in the groove of the shielding device 7 and is configured to receive secondary electrons generated by the electron beam acting on the specimen to be tested 18.

Further, the shielding device 7 is arranged on the upper end of the second beam guide 10. The shielding device 7 has a porous structure, and the secondary electrons generated by the electron beam acting on the specimen to be tested 18 can pass through the holes in the shielding device 7 and be received by the second detector 9 arranged in the groove of the shielding device 7.

Further, a second control electrode 8 is arranged between the second detector 9 and the groove. The second control electrode 8 is of a cylindrical shape and is arranged in the groove of the shielding device 7. The second detector 9 is arranged in the cylinder of the cylindrical second control electrode 8. The second control electrode 8 separates the second detector 9 from the inner wall of the groove of the shielding device 7. The second control electrode 8 has a porous structure, and the secondary electrons generated by the electron beam acting on the specimen to be tested 18 can pass through the holes in the shielding device 7 and the holes in the second control electrode 8 in sequence, and be received by the second detector 9.

In some alternative embodiments, a second control electrode 8 is arranged between the second detector 9 and the groove. The second control electrode 8 is of an annular shape and is arranged in the groove of the shielding device 7. The radial cross-section of the second control electrode 8 in a direction outwardly from a center of a circle is a groove opening outward. The groove of the second control electrode 8 is fitted into the groove of the shielding device 7. The second detector 9 is arranged in the groove of the second control electrode 8. The second control electrode 8 separates the second detector 9 from the inner wall of the groove of the shielding device 7. The second control electrode 8 has a porous structure, and the secondary electrons generated by the electron beam acting on the specimen to be tested 18 can pass through the holes in the shielding device 7 and the holes in the second control electrode 8 in sequence, and be received by the second detector 9.

The number of the second detectors 9 may be one, or two, or more, and a plurality of the second detectors 9 may be spaced along the groove of the annular shielding device 7. The second detector 9 may also be a annular detector. Due to the shielding effect of the shielding device 7 on the second detector 9, the second detector 9 would not interfere with the trajectory of the electron beam.

In some alternative embodiments, an electron beam system is provided according to an embodiment of the present disclosure. The electron beam system further includes a first lens device 4 and a second lens device 13.

The first lens device 4 is arranged on the outer periphery of the first beam guide 3, and is configured to converge the electron beam.

The second lens device 13 is arranged on the outer periphery of the second beam guide 10, and is configured to converge the electron beam.

The first lens device 4 may be a magnetic lens, an electrical lens, or an electromagnetic composite lens. The second lens device 13 may be a magnetic lens, an electrical lens, or an electromagnetic composite lens.

Further, an electron beam system is provided according to an embodiment of the present disclosure. The electron beam system further includes a third detector 16 and a third control electrode 14.

The third detector 16 is arranged between an upper pole piece and a lower pole piece of the second lens device 13, and is configured to receive the backscattered electrons generated by the electron beam acting on the specimen to be tested 18.

The third control electrode 14 is arranged between the upper pole piece of the second lens device 13 and the third detector 16.

Further, the third control electrode 14 is of an annular shape, and the third control electrode 14 has an L-shaped radial cross-section. The third detector 16 is insulated from the third control electrode 14.

In detail, the third detector 16 is of an annular shape, and the central hole of the third detector 16 is used to allow the electron beam, backscattered electrons and secondary electrons to pass through. The third control electrode 14 is of an annular shape, and a radial cross-section of the third control electrode 14 is L-shaped. A circular tube formed on one side of the L-shape is inserted into the central hole of the third detector 16, and a circular disk formed on the other side of the L-shape is arranged above the third detector 16. An insulator 15 is arranged between the third detector 16 and the third control electrode 14. The third detector 16 is connected to the third control electrode 14 in insulation. The radial cross-section of the annular third control electrode 14 is L-shaped, and can better cooperate with the second beam guide 10 and the fourth control electrode 17 to form a required electric field, thereby better controlling the movement directions of the backscattered electrons and secondary electrons generated by the electron beam acting on the specimen to be tested 18.

In some alternative embodiments, an electron beam system is provided according to an embodiment of the present disclosure. The electron beam system further includes a fourth control electrode 17 arranged between a lower pole piece of the second lens device 13 and the specimen to be tested 18. The fourth control electrode 17 can change the movement direction of the backscattered electrons generated by the electron beam acting on the specimen to be tested 18.

In some alternative embodiments, the first detector 5 is arranged on the lower end of the first beam guide 3. The first detector 5 is connected to the lower end of the first beam guide 3. The first detector 5 is at the same voltage value as the first beam guide 3. The shielding device 7 is connected to the upper end of the second beam guide 10. The shielding device 7 is at the same voltage value as the second beam guide 10.

As shown in FIGS. 1 to 3, in some alternative embodiments, among which one specific embodiment is illustrated below, specifically, the electron source 1 is configured to generate an electron beam. Electron sources 1 may be classified as field emission sources and thermal emission sources. A field emission source includes a thermal field and a cold field. A thermal emission source includes a tungsten wire, lanthanum hexaboride, and the like. In the embodiment, the electron source 1 may be any electron source 1 for generating an electron beam. The voltage value of the electron source 1 provided in the embodiment is −5 kolovolt (kV).

The voltage value of an electron acceleration structure 2 is −2 kV. After the electron beam generated by the electron source 1 passes through the electron acceleration structure 2, the movement speed of the electron beam is increased.

The voltage value of the first beam guide 3 is 10 kV. An acceleration electric field is formed between the electron acceleration structure 2 and the first beam guide 3, and the electron beam passing through the acceleration structure enters the first beam guide 3 after being accelerated. The electron beam maintains moving at a high speed in the first beam guide 3, to reduce the space charge effect in the electron beam. The first lens device 4 is arranged on the outer periphery of the first beam guide 3, and the first lens device 4 may be a magnetic lens configured to converge the electron beam moving at a high speed in the first beam guide 3.

The electron beam passes through the first beam guide 3, successively passes through the central hole of the first detector 5 of an annular shape and the central hole of the first control electrode 6 of an annular shape, the central hole of the shielding device 7 of an annular shape, and enters the second beam guide 10, the voltage value of the second beam guide 10 is 10 kV. The electron beam maintains moving at a high speed in the second beam guide 10, to reduce the space charge effect in the electron beam.

The second lens device 13 is arranged on the outer periphery of the second beam guide 10. The second lens device 13 is a composite electromagnetic lens structure, and is constituted by the magnetic lens and a decelerating electric lens formed between the lower end of the second beam guide 10 and the specimen stage 19. The voltage value of the specimen stage 19 is 0 kV. The impact point energy of the electron beam incident on the specimen to be tested 18 is 5 keV. A deflection device is arranged between the second beam guide 10 and the second lens device 13. The deflection device is configured to change the movement direction of the electron beam before being incident on the specimen to be tested 18, and can generate a scanning field in any deflection direction. Further, the deflection means includes a first deflector 11 and a second deflector 12, or more deflectors may be involved in the scanning of the electrons. The first deflector 11 may be a magnetic deflector or an electrical deflector, and the second deflector 12 may be a magnetic deflector or an electrical deflector. The first deflector 11 and the second deflector 12 cooperate to change the movement direction of the electron beam before being incident on the specimen to be tested 18.

The second lens device 13 is arranged on the outer periphery of the second beam guide 10. The electron beam passes through the second beam guide 10, and passes through the upper pole piece and the lower pole piece of the second lens device 13. The second lens device 13 converges the electron beam to act on the specimen to be tested 18. The converged scanning electron beam acts on the specimen to be tested 18 to generate the backscattered electrons and secondary electrons. The energy of the secondary electron is low, which is less than 50 eV, and the energy of the backscattered electron is 5 keV. The generated backscattered electrons and secondary electrons pass through the second lens device 13 into the second beam guide 10. The trajectories of the backscattered electrons and secondary electrons form intersections. Since the energy of the secondary electron is low, an intersection formed by the trajectories of the secondary electrons is lower than an intersection formed by the trajectories of the backscattered electrons.

The shielding device 7 is arranged on the upper end of the second beam guide 10, the shielding device 7 has the same voltage value as the second beam guide 10, and the shielding device 7 has a porous structure. A second control electrode 8 is arranged between the second detector 9 and the groove of the shielding device 7. The second control electrode 8 separates the second detector 9 from the inner wall of the groove of the shielding device 7. The second control electrode 8 has a porous structure. The voltage value of the second control electrode 8 is 0 kV. The voltage value of the second detector 9 is 10 kV.

Since the aperture of the central hole of the annular shielding device 7 of an annular shape is smaller than the aperture of the second beam guide 10, some of secondary electrons entering the second beam guide 10 will directly pass through the shielding device 7 and the second control electrode 8, and be received by the second detector 9.

The backscattered electrons and secondary electrons passing through the central hole of the shielding device 7 move toward the first control electrode 6. The voltage value of the first beam guide 3 is 10 kV, the voltage value of the second beam guide 10 is 10 kV, the voltage value of the first control electrode 6 is 7 kV. A deceleration electric field is formed between the second beam guide 10 and the first control electrode 6 along the movement directions of backscattered electrons and secondary electrons. An acceleration electric field is formed between the first control electrode 6 and the first beam guide 3.

Since the energies of the secondary electron are low, the secondary electrons do not continue to pass through the central hole of the first control electrode 6 when moving to the deceleration electric field formed between the second beam guide 10 and the first control electrode 6. Subjected to the deceleration electric field, the secondary electron will move in an opposite direction. Since the shielding device 7 is at the same voltage value as the second beam guide 10, the voltage value is 10 kV, the voltage value of the second control electrode 8 is 0 kV, and the voltage value of the second detector 9 is 10 kV. Therefore the secondary electrons moving in the opposite direction will pass through the shielding device 7 and the second control electrode 8, and be received by the second detector 9.

The aperture of the central hole of the first detector 5 is smaller than the aperture of the central hole of the first control electrode 6. Since the energy of the backscattered electron is high, the backscattered electrons will pass through the central hole of the first control electrode 6 and be received by the first detector 5 arranged on the lower end of the first beam guide 3. The first detector 5 is at the same voltage value as the first beam guide 3, and the voltage value is 10 kV.

An electron beam system is provided according to an embodiment of the present disclosure, in which a first control electrode 6 is arranged between a first beam guide 3 and a second beam guide 10, the first control electrode 6 changes the movement directions of backscattered electrons and secondary electrons generated by an electron beam generated by an electron source 1 acting on a specimen to be tested 18. The first control electrode 6 cooperates with the electric field between the first beam guide 3 and the second beam guide 10 to separate the secondary electrons and the backscattered electrons, so that the first detector 5 can receive pure backscattered electrons generated by the electron beam acting on the specimen to be tested 18. The second detector 9 can receive pure secondary electrons generated by the electron beam acting on the specimen to be tested 18.

Further, an electron beam system according to an embodiment of the present disclosure further includes a third detector 16, a third control electrode 14, and a fourth control electrode 17.

A third detector 16 is arranged between an upper pole piece and a lower pole piece of the second lens device 13. The third detector 16 is of an annular shape and is configured to receive the backscattered electrons generated by the electron beam acting on the specimen to be tested 18. The third control electrode 14 is arranged between the upper pole piece of the second lens device 13 and the third detector 16. The radial cross-section of the third control electrode 14 is L-shaped. A circular tube formed on one side of the L-shape is inserted into the central hole of the third detector 16, and a circular disk formed on the other side of the L-shape is arranged above the third detector 16. An insulator 15 is arranged between the third detector 16 and the third control electrode 14. The third detector 16 is connected to the third control electrode 14 in insulation.

A fourth control electrode 17 is arranged between the lower pole piece of the second lens device 13 and the specimen to be tested 18, and the fourth control electrode 17 can change the movement direction of the backscattered electrons generated by the electron beam acting on the specimen to be tested 18.

The voltage value of the third control electrode 14 is 5 kV, and the voltage value of the fourth control electrode 17 is 2 kV. The voltage value of the specimen stage 19 is 0 kV.

Since the voltage value of the second beam guide 10 is 10 kV, an acceleration electric field is formed between the third control electrode 14 and the second beam guide 10, an acceleration electric field is formed between the fourth control electrode 17 and the third control electrode 14, and an acceleration electric field is formed between the specimen stage 19 and the fourth control electrode 17.

The backscattered electrons with small emission angles generated by the the electron beam acting on the specimen to be tested 18 are received by the third detector 16 after accelerated by the acceleration electric field formed between the specimen stage 19 and the fourth control electrode 17 and the acceleration electric field formed between the fourth control electrode 17 and the third control electrode 14. The third detector 16 can receive more backscattered electrons by adjusting the voltage value of the third control electrode 14.

It should be noted that the voltage values of the electron source 1, the electron acceleration structure 2, the first beam guide 3, the first control electrode 6, the first detector 5, the second beam guide 10, the second control electrode 8, the third control electrode 14, the fourth control electrode 17, the specimen stage 19, and the like are not limited to the specific values of the above-described embodiments. Those skilled in the art may set the specific voltage values according to the actual situation.

As shown in FIGS. 1 to 3, in some alternative embodiments, specifically, the electron source 1 is configured to generate an electron beam. The electron sources 1 may be classified as field emission sources and thermal emission sources. A field emission source includes a thermal field and a cold field. A thermal emission source includes a tungsten wire, lanthanum hexaboride, and the like. In the embodiment, the electron source 1 may be any electron source 1 for generating an electron beam. The voltage value V1 of the electron source 1 provided in the embodiment can optionally be any value from 0 kV to −15 kV.

The voltage value V2 of the electron acceleration structure 2 can optionally be any value from 3 kV to −12 kV. After the electron beam generated by the electron source 1 passes through the electron acceleration structure 2, the movement speed is increased.

The voltage value V3 of the first beam guide 3 is 10 kV. An acceleration electric field is formed between the electron acceleration structure 2 and the first beam guide 3, and the electron beam, after being accelerated when passing through the acceleration structure, enters the first beam guide 3. The electron beam maintains moving at a high speed in the first beam guide 3, to reduce the space charge effect in the electron beam. The first lens device 4 is arranged on the outer periphery of the first beam guide 3, and the first lens device 4 may be a magnetic lens configured to converge the electron beam moving at a high speed in the first beam guide 3.

The electron beam passes through the first beam guide 3, successively passes through the central hole of the first detector 5 of an annular shape and the central hole of the first control electrode 6 of an annular shape, the central hole of the shielding device 7 of an annular shape, and enters the second beam guide 10, the voltage value V8 of the second beam guide 10 is 10 kV. The electron beam maintains moving at a high speed in the second beam guide 10, to reduce the space charge effect in the electron beam.

The second lens device 13 is arranged on the outer periphery of the second beam guide 10. The second lens device 13 is a composite electromagnetic lens structure, and is constituted by the magnetic lens and a decelerating electric lens formed between the lower end of the second beam guide 10 and the specimen stage 19. The voltage value V12 of the specimen stage 19 is 0 kV. A deflection device is arranged between the second beam guide 10 and the second lens device 13. The deflection device is configured to change the movement direction of the electron beam before being incident on the specimen to be tested 18, and can generate a scanning field in any deflection direction. Further, the deflection device includes a first deflector 11 and a second deflector 12, or more deflectors may be involved in the scanning of the electrons. The first deflector 11 may be a magnetic deflector or an electrical deflector, and the second deflector 12 may be a magnetic deflector or an electrical deflector. The first deflector 11 and the second deflector 12 cooperate to change the movement direction of the electron beam before being incident on the specimen to be tested 18.

The second lens device 13 is arranged on the outer periphery of the second beam guide 10. The electron beam passes through the second beam guide 10, and passes through the upper pole piece and the lower pole piece of the second lens device 13. The second lens device 13 converges the electron beam to act on the specimen to be tested 18. The converged scanning electron beam acts on the specimen to be tested 18 to generate the backscattered electrons and secondary electrons. The energy of the secondary electron is low, and the energy of the backscattered electron is high. The generated backscattered electrons and secondary electrons pass through the second lens device 13 into the second beam guide 10. The trajectories of the backscattered electrons and secondary electrons form intersections. Since the energy of the secondary electron is low, an intersection formed by the trajectories of the secondary electrons is lower than an intersection formed by the trajectories of the backscattered electrons.

The shielding device 7 is arranged on the upper end of the second beam guide 10, the shielding device 7 has the same voltage value as the second beam guide 10, and the shielding device 7 has a porous structure. A second control electrode 8 is arranged between the second detector 9 and the groove of the shielding device 7. The second control electrode 8 separates the second detector 9 from the inner wall of the groove of the shielding device 7. The second control electrode 8 has a porous structure. The voltage value V6 of the second control electrode 8 is 0 kV. The voltage value V7 of the second detector 9 is 10 kV.

Since the aperture of the central hole of the annular shielding device 7 is smaller than the aperture of the second beam guide 10, some of secondary electrons entering the second beam guide 10 will directly pass through the shielding device 7 and the second control electrode 8, and be received by the second detector 9.

The backscattered electrons and secondary electrons passed through the central hole of the shielding device 7 move toward the first control electrode 6. The voltage value V3 of the first beam guide is 10 kV, the voltage value V8 of the second beam guide 10 is 10 kV, the voltage value V5 of the first control electrode 6 is optionally any value from 0 kV to 10 kV. A deceleration electric field is formed between the second beam guide 10 and the first control electrode 6 along the movement directions of backscattered electrons and secondary electrons. An acceleration electric field is formed between the first control electrode 6 and the first beam guide 3.

Since the energy of the secondary electron is low, the secondary electrons do not continue to pass through the central hole of the first control electrode 6 when moving to the deceleration electric field formed between the second beam guide 10 and the first control electrode 6. Subjected to the deceleration electric field, the secondary electron will move in an opposite direction. Since the shielding device 7 is at the same voltage value as the second beam guide 10, the voltage value V8 of the second beam guide 10 is 10 kV, the voltage value V6 of the second control electrode 8 is 0 kV, and the voltage value V7 of the second detector 9 is 10 kV, therefore the secondary electrons moving in the opposite direction will pass through the shielding device 7 and the second control electrode 8, and be received by the second detector 9.

The aperture of the central hole of the first detector 5 is smaller than the aperture of the central hole of the first control electrode 6. Since the energy of the backscattered electron is high, the backscattered electrons will pass through the central hole of the first control electrode 6 and be received by the first detector 5 arranged on the lower end of the first beam guide 3. The voltage value V4 of the first detector 5 is the same as the voltage value V3 of the first beam guide 3, the voltage value V4 is 10 kV, and the voltage value V3 is 10 kV.

An electron beam system is provided according to an embodiment of the present disclosure, in which a first control electrode 6 is arranged between a first beam guide 3 and a second beam guide 10, the first control electrode 6 changes the movement directions of backscattered electrons and secondary electrons generated by an electron beam generated by an electron source 1 acting on a specimen to be tested 18. The first control electrode 6 cooperates with the electric field between the first beam guide 3 and the second beam guide 10 to separate the secondary electrons and the backscattered electrons, so that the first detector 5 can receive pure backscattered electrons generated by the electron beam acting on the specimen to be tested 18. The second detector 9 can receive pure secondary electrons generated by the electron beam acting on the specimen to be tested 18.

Further, an electron beam system according to an embodiment of the present disclosure further includes a third detector 16, a third control electrode 14, and a fourth control electrode 17.

A third detector 16 is arranged between an upper pole piece and a lower pole piece of the second lens device 13. The third detector 16 is of an annular shape and is configured to receive the backscattered electrons generated by the electron beam acting on the specimen to be tested 18. The third control electrode 14 is arranged between the upper pole piece of the second lens device 13 and the third detector 16. The radial cross-section of the third control electrode 14 is L-shaped. A circular tube formed on one side of the L-shape is inserted into the central hole of the third detector 16, and a circular disk formed on the other side of the L-shape is arranged above the third detector 16. An insulator 15 is arranged between the third detector 16 and the third control electrode 14. The third detector 16 is connected to the third control electrode 14 in insulation.

A fourth control electrode 17 is arranged between the lower pole piece of the second lens device 13 and the specimen to be tested 18, and the fourth control electrode 17 can change the movement direction of the backscattered electrons generated by the electron beam acting on the specimen to be tested 18.

The voltage value V9 of the third control electrode 14 may optionally be any value from 0 kV to 10 kV, and the voltage value V11 of the fourth control electrode 17 may optionally be any value from 0 kV to 10 kV. The voltage value V12 of the specimen stage 19 is 0 kV, and the voltage value V10 of the third detector 16 is optionally any value from 0 kV to 10 kV.

Since the voltage value V8 of the second beam guide 10 is 10 kV, an acceleration electric field is formed between the third control electrode 14 and the second beam guide 10, an acceleration electric field is formed between the fourth control electrode 17 and the third control electrode 14, and an acceleration electric field is formed between the specimen stage 19 and the fourth control electrode 17.

The backscattered electrons with a small emission angle generated by the the electron beam acting on the specimen to be tested 18 are received by the third detector 16 after being accelerated by the acceleration electric field formed between the specimen stage 19 and the fourth control electrode 17 and the acceleration electric field formed between the fourth control electrode 17 and the third control electrode 14. The third detector 16 can receive more backscattered electrons by adjusting the voltage values of the third control electrode 14 and the fourth control electrode 17.

Further, an acceleration electric field is formed between the specimen stage 19 and the fourth control electrode 17. An acceleration electric field is formed between the fourth control electrode 17 and the third control electrode 14. An acceleration electric field is formed between the third control electrode 14 and the second beam guide 10. Therefore, the specific voltage values of the specimen stage 19, the fourth control electrode 17, the third control electrode 14, and the second beam guide 10 can be flexibly controlled, so as to control the intensity of each electric field, thereby controlling the trajectories of the backscattered electrons and the secondary electrons.

For example, when the voltages applied to the first beam guide 3, the first control electrode 6, and the second beam guide 10 are changed, a deceleration electric field is formed between the second beam guide 10 and the first control electrode 6. Since the voltage values applied to the second beam guide 10 and the first control electrode 6 are changed, the intensity of the deceleration electric field is also changed. An deceleration electric field is formed between the first control electrode 6 and the first beam guide 3. Since the voltage values applied to the first control electrode 6 and the first beam guide 3 are changed, the intensity of the acceleration electric field is also changed. The backscattered electrons and secondary electrons generated by the converged scanning electron beam acting on the specimen to be tested 18 are collectively referred to as signal electrons. The signal electrons have different energies, and the signal electrons with different energies reflect different information of the specimen to be tested 18. Since both the intensity of the deceleration electric field and the intensity of the acceleration electric field can be changed as needed, the electric field forces applied to the signal electrons with different energies in the deceleration electric field and the acceleration electric field are different, and therefore the trajectories of the signal electrons of different energies are changed differently. The first detector 5 and the second detector 9 may selectively detect signal electrons with different energies. Those skilled in the art may adjust the voltage values of the electron source 1, the electron acceleration structure 2, the first beam guide 3, the first control electrode 6, the first detector 5, the second beam guide 10, the second control electrode 8, the third control electrode 14, the fourth control electrode 17, the specimen stage 19, and the like to acquire the desired signal electrons with the corresponding energies.

The above description is merely the preferred embodiments of the present disclosure, and is not intended to limit the present disclosure in any form. Although the present disclosure has been disclosed in the preferred embodiments as above, it is not intended to limit the present disclosure. Any person skilled in the art who is familiar with the present disclosure shall, without departing from the technical solution of the present disclosure, make some changes or modifications to the technical content of the present disclosure as equivalent embodiments. However, without departing from the technical solution of the present disclosure, any simple modifications, equivalent changes and modifications made to the above embodiments in accordance with the technical essence of the present disclosure shall still fall within the scope of the present disclosure.

The invention claimed is:

1. An electron beam system, comprising:
   an electron source, configured to generate an electron beam;
   a first beam guide, configured to accelerate the electron beam;
   a second beam guide, configured to accelerate the electron beam;
   a first control electrode arranged between the first beam guide and the second beam guide, configured to change movement directions of backscattered electrons and secondary electrons generated by the electron beam acting on a specimen to be tested;
   a first detector arranged between the first beam guide and the first control electrode, configured to receive the backscattered electrons generated by the electron beam acting on the specimen to be tested;
   a first lens device arranged on an outer periphery of the first beam guide, configured to converge the electron beam;
   a second lens device arranged on an outer periphery of the second beam guide, configured to converge the electron beam;
   a third detector arranged between an upper pole piece of the second lens device and a lower pole piece of the second lens device, configured to receive backscattered electrons generated by the electron beam acting on the specimen to be tested; and
   a third control electrode arranged between the upper pole piece of the second lens device and the third detector.

2. The electron beam system of claim 1, wherein the first control electrode is of an annular shape, and a thickness of a radial cross-section of the first control electrode is gradually increased in a direction outwardly from a center of a circle.

3. The electron beam system of claim 1, wherein the first control electrode is of an annular shape, and a radial cross-section of the first control electrode is of a rectangular, triangular, or trapezoidal shape.

4. The electron beam system of claim 1, further comprising:
   a shielding device, wherein the shielding device is of an annular shape, and a radial cross-section of the shielding device in a direction outwardly from a center of a circle is a groove opening outward; and
   a second detector arranged in the groove of the shielding device, configured to receive secondary electrons generated by the electron beam acting on the specimen to be tested, wherein a second control electrode is arranged between the second detector and the groove of the shielding device.

5. The electron beam system of claim 4, wherein the shielding device has a porous structure, and the shielding device is arranged on an upper end of the second beam guide.

6. The electron beam system of claim 1, wherein the third control electrode is of an annular shape, and a radial cross-section of the third control electrode is L-shaped; and
   the third detector is connected to the third control electrode in insulation.

7. The electron beam system of claim 1, further comprising:
   a fourth control electrode, arranged between a lower pole piece of the second lens device and the specimen to be tested;
   wherein the first detector is arranged on a lower end of the first beam guide.

* * * * *